United States Patent
Eisert et al.

(10) Patent No.: US 7,195,942 B2
(45) Date of Patent: Mar. 27, 2007

(54) RADIATION EMITTING SEMICONDUCTOR DEVICE

(75) Inventors: Dominik Eisert, Regensburg (DE); Volker Haerle, Laaber (DE); Frank Kuehn, München (DE); Manfred Mundbrod-Vangerow, Günzburg (DE); Uwe Strauss, Bad Abbach (DE); Ulrich Zehnder, Regensburg (DE)

(73) Assignee: Osram GmbH (DE)

( * ) Notice: Subject to any disclaimer, the term of this patent is extended or adjusted under 35 U.S.C. 154(b) by 216 days.

(21) Appl. No.: 10/837,828

(22) Filed: May 3, 2004

(65) Prior Publication Data
US 2005/0003565 A1 Jan. 6, 2005

Related U.S. Application Data

(62) Division of application No. 09/781,753, filed on Feb. 12, 2001, now Pat. No. 6,730,939.

(30) Foreign Application Priority Data
Feb. 15, 2000 (DE) .......................... 100 06 738

(51) Int. Cl.
*H01L 21/50* (2006.01)

(52) U.S. Cl. .................... 438/33; 438/113; 349/158

(58) Field of Classification Search ............... 438/113, 438/33, 68, 69, 42, 271, 444, 458, 460, 462, 438/464; 349/158, 187
See application file for complete search history.

(56) References Cited

U.S. PATENT DOCUMENTS

| 3,202,543 A | 8/1965 | Thun et al. .................. 117/210 |
| 4,459,100 A | 7/1984 | de la Burde et al. ....... 131/296 |

(Continued)

FOREIGN PATENT DOCUMENTS

CN          1224533        7/1997
CN          1158017 A      8/1997

(Continued)

OTHER PUBLICATIONS

JP 4164376 A, E–1270, 1992 vol. 16/No. 465—Abstract.
Song Jae Lee et al., "Efficiency Improvement in Light–Emitting Diodes Based on Geometrically Deformed Chips", *SPIE Conference on Light Emitting Diodes*, San Jose, CA., Jan. 1999, S. 237–248.

(Continued)

*Primary Examiner*—Michael Lebentritt
*Assistant Examiner*—Andre' Stevenson
(74) *Attorney, Agent, or Firm*—Fish & Richardson P.C.

(57) ABSTRACT

Radiation-emitting semiconductor device, method for fabricating same and radiation-emitting optical device.

A radiation-emitting semiconductor device with a multilayer structure (100) comprising a radiation-emitting active layer (10), with electrical contacts (30, 40) for impressing a current in the multilayer structure (100) and with a radiotransparent window layer (20). The window layer is arranged exclusively on the side of the multilayer structure (100) facing away from a main direction of radiation of the semiconductor device and has at least one side wall that includes a first side wall portion (20a) which extends obliquely, concavely or in a stepwise manner toward a central axis of the semiconductor device lying perpendicular to the multilayer sequence. In its subsequent extension toward the back side, viewed from the multilayer structure, the side wall changes over into a second side wall portion (20b) that extends perpendicularly to the multilayer structure, that is, parallel to the central axis, and the portion of the window layer (20) encompassing the second side wall portion (20b) forms a mounting pedestal for the semiconductor device. The first and second side wall portions are fabricated especially preferably by means of a saw blade having a shaped edge. In a preferred optical device, the semiconductor device is mounted window layer downward in a reflector cup.

34 Claims, 11 Drawing Sheets

U.S. PATENT DOCUMENTS

| | | | |
|---|---|---|---|
| 4,965,223 A | 10/1990 | Steranka | 437/127 |
| 5,087,949 A | 2/1992 | Haitz | 357/17 |
| 5,233,204 A | 8/1993 | Fletcher et al. | 257/13 |
| 5,309,001 A | 5/1994 | Watanabe et al. | 257/99 |
| 5,349,211 A | 9/1994 | Kato | |
| 5,387,804 A | 2/1995 | Suzuki et al. | |
| 5,547,906 A * | 8/1996 | Badehi | 438/109 |
| 5,585,648 A | 12/1996 | Tischler | 257/77 |
| 5,744,828 A | 4/1998 | Nozaki et al. | 257/94 |
| 5,753,940 A | 5/1998 | Komoto | |
| 5,753,966 A | 5/1998 | Morita et al. | 257/627 |
| 5,767,581 A | 6/1998 | Nakamura et al. | 257/749 |
| 5,779,924 A | 7/1998 | Krames et al. | 216/24 |
| 5,821,568 A | 10/1998 | Morita et al. | |
| 5,864,171 A | 1/1999 | Yamamoto et al. | 33/0 |
| 5,998,232 A | 12/1999 | Maruska | 438/46 |
| 6,040,235 A * | 3/2000 | Badehi | 438/464 |
| 6,117,707 A * | 9/2000 | Badehi | 438/113 |
| 6,143,588 A * | 11/2000 | Glenn | 438/116 |
| 6,168,965 B1 * | 1/2001 | Malinovich et al. | 438/66 |
| 6,194,743 B1 | 2/2001 | Kondoh et al. | 257/94 |
| 6,229,160 B1 | 5/2001 | Krames et al. | 257/94 |
| 6,291,839 B1 | 9/2001 | Lester | 257/91 |
| 6,329,224 B1 * | 12/2001 | Nguyen et al. | 438/127 |
| 6,429,462 B1 | 8/2002 | Shveykin | 257/95 |
| 6,459,100 B1 | 10/2002 | Doverspike et al. | |
| 6,630,780 B1 * | 10/2003 | Yan | 313/493 |

FOREIGN PATENT DOCUMENTS

| | | | |
|---|---|---|---|
| DE | 2416098 | 10/1975 | |
| DE | 2626564 | 12/1976 | |
| DE | 25 43 222 | 3/1977 | |
| DE | 2813930 | 10/1979 | |
| DE | 4130878 | 3/1993 | |
| DE | 4305296 | 8/1994 | |
| DE | 4427840 | 2/1996 | 21/786 |
| DE | 19536438 | 4/1997 | |
| DE | 19807758 | 12/1998 | |
| DE | 199 27945 | 3/2000 | |
| EP | 0 083 510 | 12/1982 | 7/26 |
| EP | 0405757 | 2/1991 | |
| EP | 0 544 408 | 6/1993 | |
| EP | 0562880 | 9/1993 | |
| EP | 0650202 | 4/1995 | |
| EP | 0779667 | 6/1997 | |
| EP | 0 977 277 | 2/2000 | |
| JP | 53-61986 | 2/1978 | |
| JP | 59004088 | 1/1984 | |
| JP | 61110476 | 5/1986 | |
| JP | 61296780 | 12/1986 | |
| JP | 01-099266 | 4/1989 | |
| JP | 03227078 | 10/1991 | |
| JP | 03283675 | 12/1991 | |
| JP | 04137771 A | 5/1992 | |
| JP | 06310752 | 4/1993 | |
| JP | 05327012 | 12/1993 | |
| JP | 06237012 | 8/1994 | |
| JP | 07086635 | 3/1995 | |
| JP | 08102549 | 4/1996 | |
| JP | 09036431 | 2/1997 | |
| JP | 10-326910 | 8/1998 | |
| JP | 10256602 | 9/1998 | |
| JP | 10-341035 | 12/1998 | |
| WO | WO 98/07195 | 2/1998 | |

OTHER PUBLICATIONS

Schnitzer et al., "30% external quantum efficiency from surface textured, thin–film light–emitting diodes", *Appl. Phys. Lett.* 63 (16), Oct. 18, 1993, pp. 2174–2176.

Deckman et al., "Applications of surface textures produced with natural lithography", *J. Vac. Sci. Technol.* B 1 (4), Oct.–Dec. 1983, pp. 1109–1112.

Deckman et al., "Natural Lithography", *Appl. Phys. Lett.* 41 (4), Aug. 15, 1982, pp. 377–379.

Molnar et al., "Blue–violet light emitting gallium nitride p–n junctions grown by electron cyclotron resonance–assisted molecular beam epitaxy", *Appl. Phys. Lett.* 66 (3), Jan. 16, 1995, pp. 268–270.

Yablonovitch et al., "Van der Waals bonding of GaAs epitaxial liftoff films onto arbitrary substrates", *Appl. Phys. Lett.* 56 (24), Jun. 11, 1990, pp. 2419–2421.

Sheu et al., "High transparency Ni/Au ohmic contact to p–type GaN", *App. Phys. Lett*, 74 (16), 1999, pp. 2340–2342.

* cited by examiner

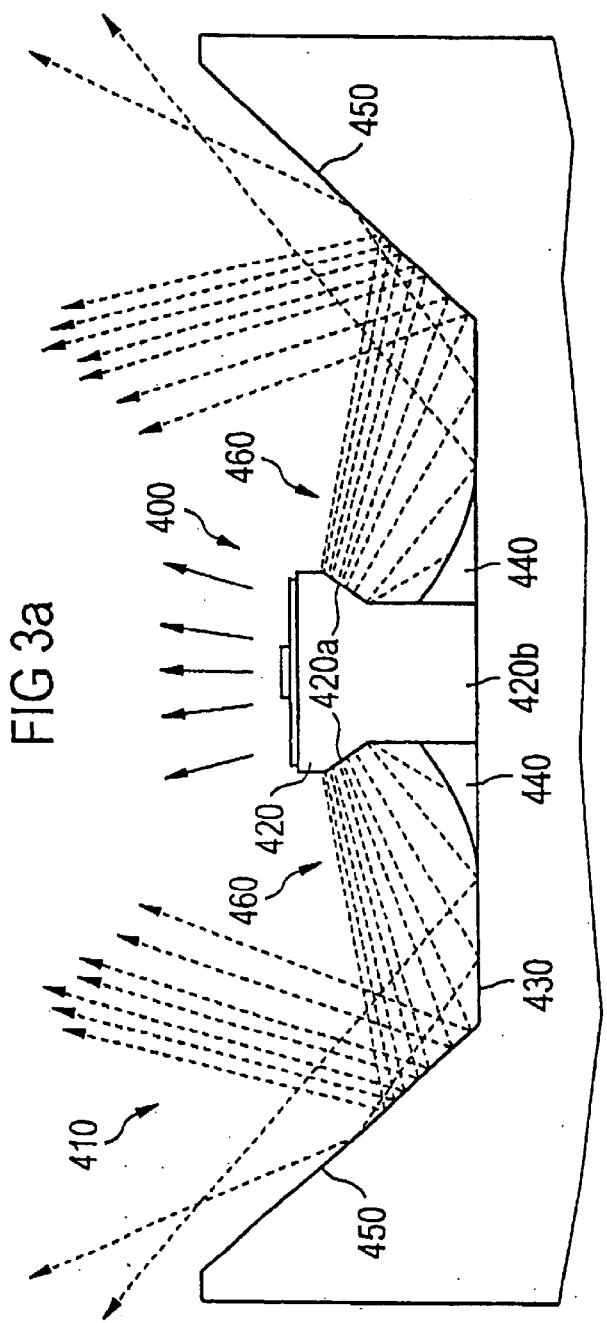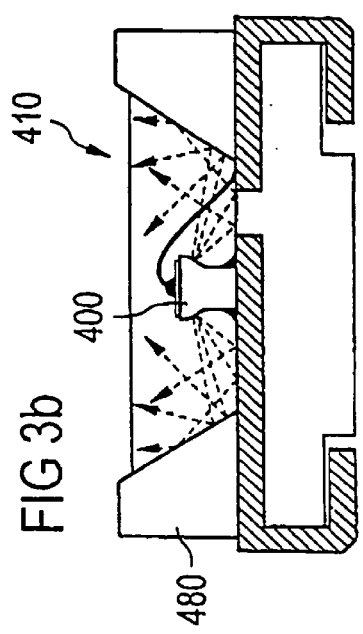

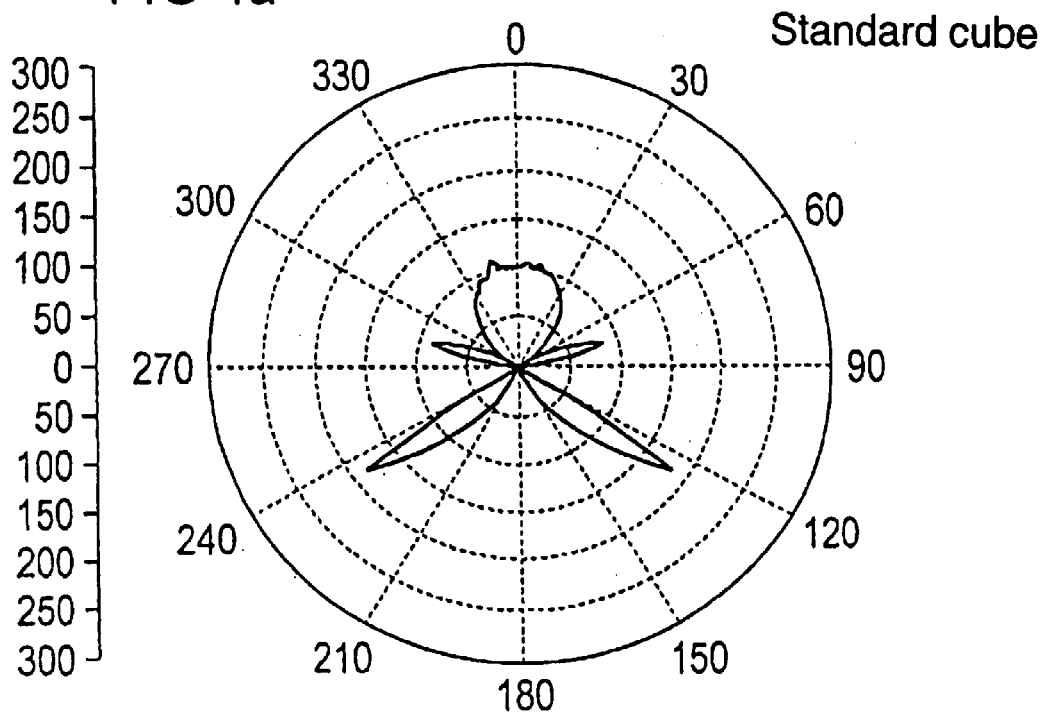
FIG 4a — Standard cube
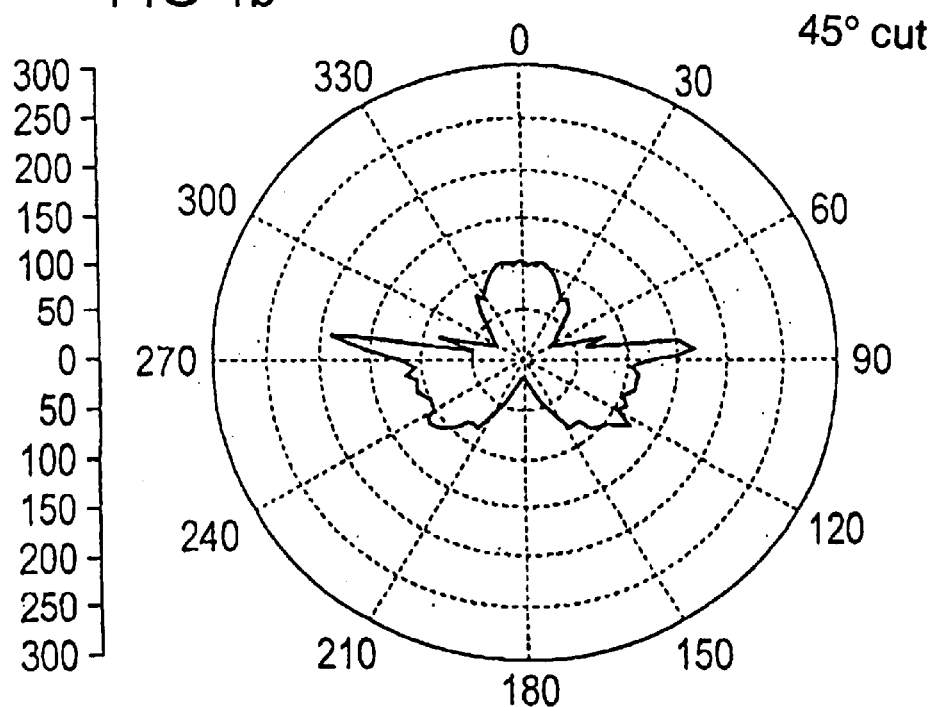
FIG 4b — 45° cut

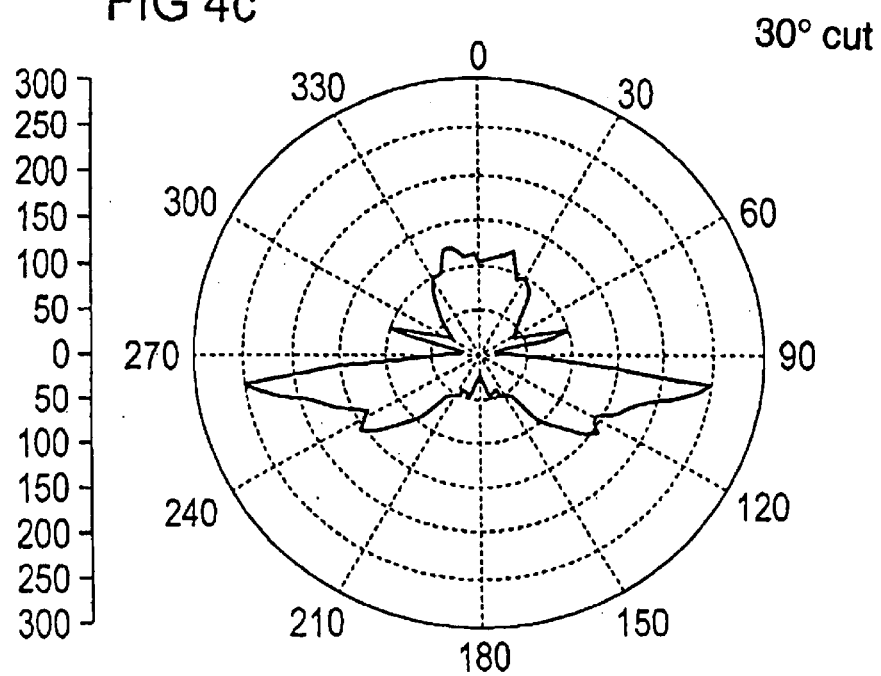
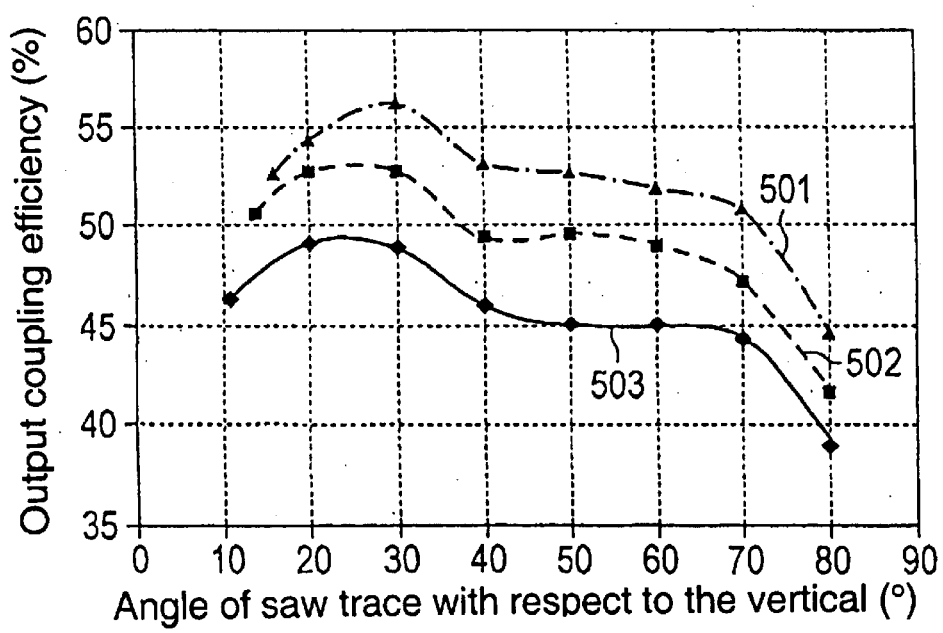

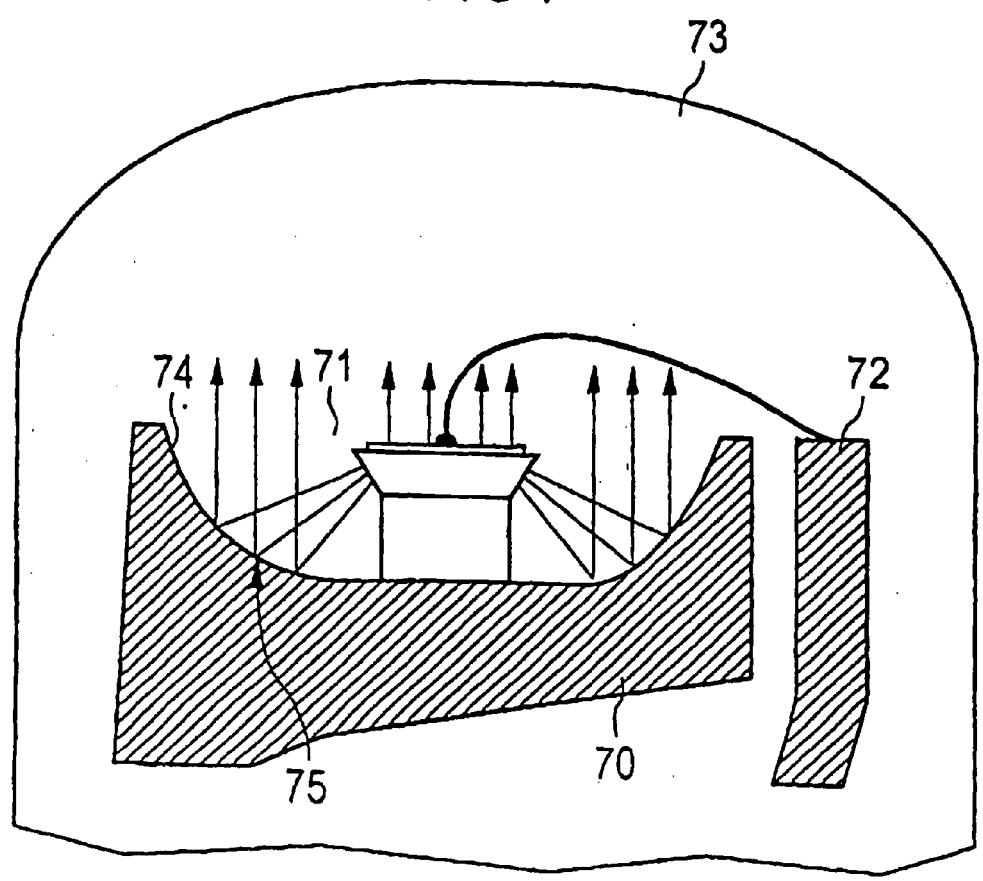

RADIATION EMITTING SEMICONDUCTOR DEVICE

This application is a divisional of U.S. application Ser. No. 09/781,753, filed Feb. 12, 2001 now U.S. Pat. No. 6,730,939.

TECHNICAL FIELD

Radiation-emitting semiconductor device, method for fabricating same and radiation-emitting optical device The invention concerns a radiation-emitting semiconductor device in which a multilayer structure comprising a radiation-generating active region has assigned to it a window layer for coupling out radiation.

BACKGROUND

It relates in particular to a radiation-emitting semiconductor device comprising a nitride-based active multilayer structure arranged on an SiC-based epitaxial growth substrate and to a radiation-emitting optical device equipped with such a radiation-emitting semiconductor device.

The invention is further directed to a method for fabricating the radiation-emitting semiconductor device and to an optical device comprising a semiconductor body of this kind.

Typically, present-day radiation-emitting optical devices, especially light-emitting-diode devices, are equipped substantially exclusively with right-parallelepipedal radiation-emitting semiconductor devices, usually embedded in transparent casting material. A major difficulty with such devices is the large difference between the refractive indices of the semiconductor materials normally used in optical semiconductor devices (n>2.5) and those of the conventionally available casting materials (epoxy resin, for example; nepoxy >>1.5). Thus, the critical angle of total reflection at the boundary between the semiconductor body and the casting material is very small. It is for this reason that a substantial portion of the light generated in the active region fails to be coupled out of the semiconductor body, due to total reflection on the chip surfaces, and goes to waste inside it. Given a defined electrical current flowing through the semiconductor device to generate the light, the brightness of the device is therefore limited.

In the case of GaN-based light-emitting diode chips, where the epitaxial layer sequence is arranged on a substrate (for example, a silicon carbide substrate) that has a higher refractive index than the epitaxial layer sequence, the special problem also arises that with the conventional right-parallelepipedal chip geometry, the portion of the radiation coupled out by the lateral sides of the substrate is output in the direction of the back of the chip at a very acute angle with the lateral side of the substrate. This radiation is therefore incident on a housing mounting surface to which the chip is attached, striking it at a very steep angle and very close to the chip. This entails the disadvantages that, first, because of the acute angle of incidence, a large portion of the radiation is absorbed in the chip mounting surface, and second, there is considerable risk that some of the radiation will strike and be absorbed by the conductive adhesive normally used to secure the chip.

DE 198 07 758 A1 proposes a radiation-emitting semiconductor body which, to increase the light yield of the active region in the intended direction of radiation of the semiconductor body, comprises a subsequently added so-called primary window layer whose continuous lateral face forms an obtuse angle with the plane of extension of the multilayered heterostructure. The continuous lateral face forms an obtuse angle of between 110° and 140° with the plane of the active region. The primary window layer is formed by the epitaxial growth substrate or by an epitaxial layer grown separately thereon.

In addition, the semiconductor body in accordance with DE 198 07 758 A1 can comprise a further, so-called secondary window layer that is arranged by epitaxy or wafer bonding on the side of the active region facing away from the primary window layer, i.e., on the underside of the semiconductor body, and whose continuous lateral face forms an angle of between 40° and 70° with the plane of the active region. The semiconductor body therefore has obliquely disposed chip sides that are continuous from the top side to the underside.

This chip geometry serves primarily to make the face of the chip extending parallel to the active region larger than the active region and to cause all of the light striking the oblique side walls of the primary window to be reflected internally in the intended direction of radiation.

In addition, the secondary window layer performs the task of coupling out of the semiconductor body, via the oblique lateral faces of the secondary window layer, light that is emitted by the active region toward the back, i.e., in the direction of the mounting surface of the semiconductor body.

To reduce the outputting of light in the backward direction and to deflect this light to the front side, preferably within the very semiconductor body, a reflective coating is provided on all of the oblique sides of the chip.

This known chip geometry, which is intended primarily to improve the coupling-out of light via the front side, raises the following problems in particular:

(i) In the fabrication of the oblique lateral faces, a substantial portion of the area of the active epitaxial layer sequence present on the wafer is wasted, since the oblique lateral faces are produced by making a V-shaped trough from the active-region side.

(ii) The thickness of the secondary window layer is severely limited in order to preserve a sufficiently large chip mounting surface, thereby ensuring that no tilting of the chip occurs as it being mounted in a light-emitting-diode housing, there is current spreading to the entire active region, insofar as possible, there is adequate heat dissipation from the active region, the chip has sufficient mechanical stability. Thus, its width is preferably only about 10 to 40% of the lateral width of the active region.

(iii) The oblique sides meet the chip mounting surface of a light-emitting-diode housing to form a wedge-shaped gap, which in the case of conventional plastic LED housings is usually filled with transparent casting material. When the temperature of the device increases during operation and/or due to an increase in ambient temperature, as occurs, for example, in motor-vehicle applications, because of the high thermal expansion of ordinary casting compounds the chip is subjected to considerable mechanical stresses, due to which the risk of delamination of the chip from the chip mounting surface of the housing is substantially increased over that of right parallelepipedal chips.

(iv) The fabrication of the secondary window layer is technically very onerous, since this layer must be added by epitaxial growth or wafer bonding.

(v) The underside of the chip, which is the mounting surface, is the smallest surface of the semiconductor body, over which the widely projecting upper window region is disposed. There is accordingly a high risk that with an automatic chip mounting technique conventionally employed in chip mounting, usually a pick-and-place method, tilting of the chip and hence tilting of the beam axis of the light-emitting-diode device may occur. This risk is reduced if only one primary window layer and no secondary window layer is present.

(vi) The thickness of the lower window layer, if any, must be kept as small as possible for the reasons stated above under (ii) and (v). However, this means that a substantial portion of this window will be covered with an adhesive normally used to mount LED chips and thus will not be able to contribute fully—if at all—to the coupling-out of the light.

Points (ii) and (v) take on greater significance as the chip edge length decreases, i.e., as the cross section of the active region becomes smaller, an effect that is constantly being striven for in order to obtain the greatest possible chip yield from a single wafer, because the smaller the edge length the smaller the resulting chip mounting surface, in view of the proposed chip geometry. For these reasons, the bottom window layer is made as thin as possible or is omitted.

In terms of practical feasibility, the chip geometry known from DE 198 07 758 A1 is suited, if at all, only to GaP-based material systems, involving the epitaxial growth of thick layers of both types of semiconductors that are sufficiently electrically conductive to make it possible, in particular, to create the proposed lower window layer and simultaneously to achieve current spreading to nearly the entire active region.

In the nitride-based III–V semiconductor material system, which includes in particular GaN, InN and AlN and all ternary and quaternary mixed crystals based on GaN, InN and AlN, such as, for example, AlGaN, InGaN, AlInN and AlGaInN, p-doped layers in particular have a sufficiently low electrical resistance only if they are comparatively thin. Thus, the only way to fabricate a thick bottom window corresponding to the arrangement described above—especially in the case of conventional GaN-based active layer sequences, in which the bottom window layer would have to be on the p-type side—is by wafer bonding, which is technically very onerous and means putting up with the above difficulties.

Known from U.S. Pat. No. 5,233,204 is a geometry for a light-emitting semiconductor body based on InGaAlP, in which a thick, transparent epitaxial layer of GaP, GaAsP or AlGaAs is arranged between an absorbing substrate and an active layer structure. The lateral faces of the thick transparent epitaxial layer are arranged obliquely to the active layer structure in such manner as to produce funnel-shaped layer. As a result, more of the radiation emitted by the active layer structure in the direction of the substrate strikes the lateral face of the transparent layer at an angle that is smaller than the total reflection angle.

However, substantial losses of light occur with the chip geometry proposed in U.S. Pat. No. 5,233,204. One cause of these losses is total reflection at the boundary from the active layer structure to the thick transparent epitaxial layer (refractive index$_{active layer}$> refractive index$_{window}$) and subsequent absorption in the active layer sequence. Another cause is absorption in the radiation-absorbing epitaxial substrate. In addition, considerable additional technical outlay is involved in fabricating the window layer as a thick transparent epitaxial layer.

To improve the coupling-out of light, it has been proposed elsewhere to fabricate semiconductor devices having, for example, a triangular or parallelogramoid lateral cross section; in this regard, see the publication Song Jae Lee, Seog Won Song, "Efficiency Improvement in Light-Emitting Diodes Based on Geometrically Deformed Chips," SPIE Conference on Light-Emitting Diodes, San Jose, Calif., January 1999, pages 237 to 248. In these arrangements, reflection in the chip is increased because the angles of reflection change frequently. At the same time, however, the radiation-generating layer, the contacts, or other layers of the semiconductor device must be improved so that they absorb as little light as possible.

SUMMARY

An object of the invention is to provide a radiation-emitting semiconductor body of the species cited in the introduction hereto that is suitable for the mass production of light-emitting-diode devices and that provides improved coupling-out of light and that in particular ensures a high chip yield from a single wafer. The semiconductor body is intended to be suitable in particular for mounting in conventional light-emitting-diode housings by means of conventional automatic chip mounting systems used in semiconductor technology.

A method for fabricating such a semiconductor body is also provided. A further object of the invention is to provide an improved radiation-emitting optical device.

Hereinafter, the term "nitride-based" encompasses in particular all III–V semiconductor mixed crystals containing binary, ternary and quaternary nitrogen, such as GaN, InN, AlN, AlGaN, InGaN, INAlN and AlInGaN.

Analogously, the term "SiC-based" hereinafter signifies any mixed crystal whose essential properties bear the stamp of the constituents Si and C.

The term "epitaxial substrate" is to be understood hereinafter as the substrate used as a foundation for the epitaxial growth of the very first layer of the active layer sequence.

Further, the terms "front side" or "top side" hereinafter mean that side of the semiconductor body located after the active multilayer sequence in the intended direction of radiation of the device. "Back side" or "underside" therefore means the side facing away from the front side.

In the semiconductor body of the species recited in the introduction hereto, according to the invention the transparent window layer has at least one lateral face which, viewed from the multilayer structure, passes over a first layer-thick section of the window layer obliquely, concavely or in a stepwise manner with respect to a central axis of the semiconductor body lying perpendicular to the plane of growth of the epitaxial layers, and in its subsequent extension in the direction of a mounting surface of the semiconductor body, i.e., over a second layer-thick section adjacent the first layer-thick section, is disposed parallel to the central axis, i.e., vertically to the mounting surface of the semiconductor body.

With reference to the mounting surface of the semiconductor body, the window layer, as its underside, is arranged exclusively beneath the multilayer structure, and the obliquely, concavely or stepwise-extending side walls of the window change over into side-wall portions that extend vertically to the mounting surface and form a parallelepipedoid, prismoid or cylindroid mounting pedestal.

The latter has the particular advantage that the surface area of the underside of the semiconductor device is not greatly diminished, thereby reducing tilting moments of the chip during conventional automated mounting in a housing and thus also decreasing the risk of tilting of the device.

The mounting pedestal further has the advantage that the semiconductor body can be adhesively secured in a housing by this same parallelepipedoid, prismoid or cylindroid bottom portion of the device, which extracts little light. Owing to the geometry according to the invention of the semiconductor body, the surface by which the semiconductor body is affixed to a mounting surface of the housing is large enough to provide, on the one hand, a stable mechanical connection between the semiconductor body and the housing, and on the other hand, a sufficiently large contact area, both electrical and thermal.

A further particular advantage deriving from the parallelepipedoid, prismoid or cylindroid mounting pedestal is that despite the obliquely extending lateral faces, no wedge-shaped gap of the kind normally filled with transparent casting material in a conventional plastic LED housing is created between the semiconductor body and the mounting surface of an appurtenant housing. The forces pushing the semiconductor body away from the mounting surface, brought about by the high thermal expansion of ordinary transparent casting compounds and occurring with an increase in the temperature of the device during operation and/or due to an increase in ambient temperature, as happens to a not insubstantial degree in motor-vehicle applications, for example, are markedly reduced in comparison to known chip geometries comprising oblique window sides. There is consequently much less risk of delamination of the chip from the mounting surface of the housing, which mounting surface also simultaneously serves as an electrical terminal for the semiconductor body when an electrically conductive substrate is used.

The semiconductor body geometry according to the invention further provides the advantage of minimizing the loss of active multilayer stricture during the production of this geometry. Nearly all of the wafer area can be used as an active region for the semiconductor body. The number of semiconductor bodies per wafer obtained with the chip geometry according to the invention is unchanged with respect to the fabrication of conventional right-parallelepipedal semiconductor bodies.

A further advantage is that the front side of the device is large enough so that a large portion of the radiation emitted forwardly by the active region can be coupled out directly in the forward direction, without any additional losses, especially absorption losses, in an additional upper window.

The semiconductor body geometry according to the invention is suitable especially preferably for, in particular, semiconductor bodies with a nitride-based active multilayer structure (i.e., of the material system In1xxxyAlxGayN, where 0£x£1, 0£y£1 and x+y £1) on an SiC-based substrate or other transparent substrate whose material has a higher refractive index than does the active multilayer structure. One reason for this is that nitride-based layers have a sufficiently low electrical resistance only when they are very thin. This is especially true of p-doped layers of this kind.

Because the overlap between the angular range of the radiation incident on the lateral sides of the substrate and the angular range coupled out by the lateral sides of the substrate is improved with respect to that of conventional right-parallelepipedal chips, the semiconductor body according to the invention is capable of coupling out a comparatively large fraction of the radiation generated in the active region on its very first transit through the chip, i.e., when the radiation strikes the chip surface for the first time. This reduces total reflection on the lateral faces, increases the direct coupling-out of light, and diminishes absorption due to long optical paths and numerous reflections in the device, i.e., in adjacent window regions.

The obliquely disposed, concave or stepped portion of the lateral face is especially preferably realized so that a large portion of the radiation coupled out by the semiconductor device through the lateral sides is emitted within an angular range of between 50° and 90° relative to the central axis of the semiconductor device. This advantageously achieves the result that in the case of a housing design that includes a reflector, the type of housing conventionally used for light-emitting diode devices, the radiation coupled out laterally through the window layer strikes the oblique side walls of the reflector. This has the significant advantage that the radiation strikes the inside walls of the reflector at a relatively obtuse angle, thereby improving the reflection, especially in the case of plastic reflector walls.

As shown in FIG. 2, in conventional right-parallelepipedal chips, owing to the steep angle of emission, most of the radiation coupled out by the window layer is reflected by the sides of the chip (cf. FIG. 2) onto the floor of the reflector, which reflects comparatively little radiation, on the one hand because of the steeper angle of incidence of the radiation and on the other hand because of the inevitable partial covering of this floor with adhesive.

In a further especially preferred manner, the material of the window layer has a higher refractive index than the adjacent material of the active multilayer structure. As a result, the radiation emitted backwardly by the active region is advantageously reflected less at the boundary between the multilayer structure and the window layer and the radiation coupled into the window layer is compressed.

The chip geometry according to the invention is used especially preferably with nitride-based LED chips whose active multilayer structure is fabricated on an SiC or SiC-based epitaxial substrate. Here, refractive indexactive layer> refractive indexsubstrate.

In a chip with a square cross section, the ratio of the edge length of the multilayer structure to the edge length of the mounting pedestal is especially preferably 1.2 to 1.6. In the case of a window with planar, oblique lateral faces, these sides especially preferably form an angle a with the central axis of the semiconductor device defined by 20° £ α £ 40°.

With this embodiment, on the one hand, a good current spread over the surface of the multilayer structure is ensured, and on the other hand, the voltage drop at the mounting pedestal during the operation of the semiconductor device is within an acceptable range.

In a further advantageous embodiment, it is provided that at least the obliquely disposed, concave or stepped region of the window layer is roughened.

It is especially advantageous if the window is the epitaxial growth substrate, such as, for example, in the case of a GaN-based mutlilayer structure on an SiC-based epitaxial substrate forming the window.

In a radiation-emitting optical device according to the invention containing a radiation-emitting semiconductor device having the features disclosed hereinabove, the semiconductor device is mounted in a reflector recess in a housing base body. The reflector recess preferably has an advantageously planar floor on which the radiation-emitting semiconductor device is mounted and which is surrounded by a planar reflector wall obliquely disposed with respect to the bottom. The housing base body is made of a reflective material, especially a suitable plastic, which is advantageously filled with reflection-increasing material, and comprises electrical connecting elements. The semiconductor device is placed with its mounting surface on the floor and connected thereto with adhesive.

The height of the mounting pedestal is so selected that the largest possible proportion of the radiation coupled out by the obliquely disposed, concave or stepped region of the window layer strikes the oblique reflector walls and not the floor of the reflector recess and is reflected in the direction of radiation of the device.

Since the oblique wall surfaces cannot be brought arbitrarily close to the semiconductor device—it being necessary for the floor to provide enough space, first, for the semiconductor device to be mounted in the housing with a certain positioning tolerance, and second, for a bonding-wire connection to be made from the top side of the chip to an external electrical connecting element—the mounting pedestal is an essential element of the semiconductor device in accordance with the invention.

In a particular embodiment, the side walls of the reflector are realized as paraboloid in such manner that the radiation coupled out via the obliquely disposed, concave or stepped region of the window layer is reflected upwardly to the active layer, predominantly in parallel, in a given direction.

The lower angle of the radiation relative to the floor carries the further important advantage of reducing absorption of the radiation, especially in the case of reflection on plastic surfaces, because the smaller the angle of incidence of the radiation on the plastic surfaces, the lower the absorption.

The reflector walls can advantageously be rendered highly reflective in a simple manner, for example by coating them with Al or Ag. In addition, there is no risk that the oblique reflector walls will become contaminated with adhesive while the semiconductor device is being mounted in the housing.

The contact metallization on the underside of the mounting pedestal is preferably a gridded contact. It has been found that the back-reflection of backwardly emitted radiation in the direction of the front side of the chip is improved when the contact metallization on the back side is not made to cover its entire surface.

In a method for fabricating a radiation-emitting device in accordance with the invention, it is provided, after the active multilayer structure has been put in place and optionally structured on a large-area substrate wafer, to saw with a saw blade provided with a shaped edge into the wafer so fabricated, from what is to be the back side of the semiconductor device, i.e., from the side of the window layer facing away from the active multilayer structure, to a predetermined depth at which the blade-shaped portion of the saw blade, in which the surfaces of the saw blade are parallel, penetrates partway into the substrate wafer, preferably to the level of the mounting pedestal.

The term "shaped edge" is to be understood herein as a working side of the saw blade shaped according to certain criteria to produce a sawcut of a defined geometry. The shaped edge in the present case is the negative shape of the obliquely disposed, concave or stepped portion of the window layer and is therefore configured as V-shaped, convex or stepped.

This step of making a shaped sawcut is followed by the separation of the large-area wafer arrangement, with the multilayer structure thereon, into a plurality of radiation-emitting semiconductor devices by dividing the wafer composite along the sawcuts by breaking it or making a second sawcut.

Especially preferably, the sawing with the saw blade having a shaped edge is preceded by separation of the active multilayer structure along the intended sawcuts, preferably by etching.

In a further preferred manner of implementation of the method, it is provided that the contact surfaces, formed in particular by metallization layers, are produced before the back of the wafer is sawn into.

In an especially preferred improvement of the method, a GaN-based epitaxial layer sequence suitable for emitting radiation in the ultraviolet, blue and/or green regions of the spectrum is first disposed on an SiC-based substrate wafer. The substrate material is preferably so selected that it is at least semitransparent to at least a large proportion of the radiation emitted by the active region of the multilayer structure and has a higher refractive index than the material of the epitaxial layer sequence.

Contact layers are then disposed on the front side of the epitaxial layer sequence and on the back side of the substrate wafer, after which the epitaxial layer sequence is separated, preferably by etching, into a plurality of mutually separate active multilayer structures. This is followed by the step of making a shaped sawcut from the side of the substrate wafer facing away from the epitaxial layer sequence.

DESCRIPTION OF DRAWINGS

Further preferred modifications and improvements of the invention will emerge from the exemplary embodiments described hereinbelow in connection with FIGS. 1a to 11, wherein:

FIGS. 3a to 3e are schematic diagrams of the radiating behavior of a semiconductor device according to the invention comprising planar, oblique lateral faces of a window layer in a reflector recess of a device housing, FIGS. 4a to 4c provide a comparison of the radiation characteristic of a conventional light-emitting semiconductor device with those of two light-emitting semiconductor devices according to the invention comprising planar, oblique lateral faces of a window layer, FIG. 5 is a graph showing the optical output coupling efficiency of a semiconductor device according to the invention comprising planar oblique lateral faces of the window layer as a function of the angle made by the oblique lateral faces with the vertical central axis of the semiconductor device, FIG. 7 is a schematic cross-sectional representation of a light-emitting optical device according to the invention comprising paraboloid reflector walls.

DETAILED DESCRIPTION

Figure 1A:
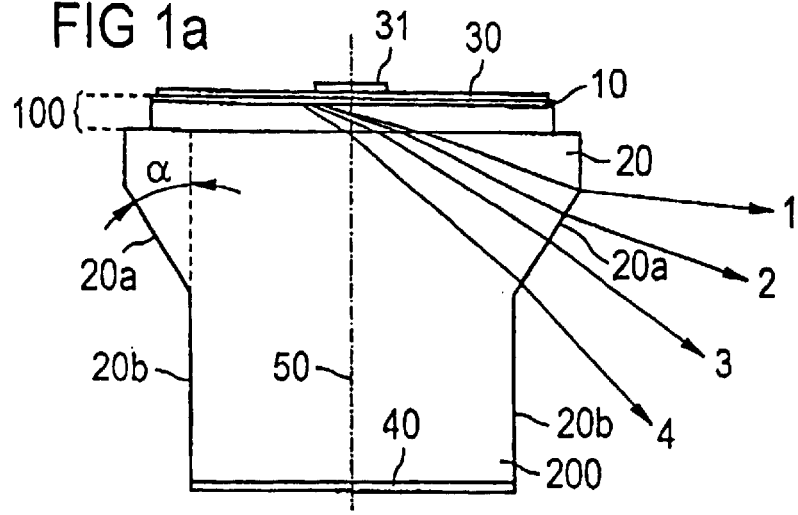
FIGS. 1a to 1c are schematic cross sections through alternative embodiments of the light-emitting semiconductor device according to the invention.

FIG. 1a is a purely schematic cross section through a light-emitting semiconductor device in accordance with the invention. An active layer 10 generating the light, for example an InGaN-based single-quantum-well (SQW) or multi-quantum-well (MQW) structure, lies within a multilayer structure 100, for example entirely composed of a plurality of nitride-based III–V semiconductor layers. The exact configuration of such a multilayer structure depends on the material system and the desired properties of the device. Details in this regard are known from the prior art and thus will not be explicated further in the present context.

The multilayer structure 100 is produced, for example, by a metallo-organic vapor-phase epitaxial process on a window layer 20 having an electrical contact 40 on its underside. The multilayer structure 100 is topped by a second electrical contact 30, which in the exemplary embodiment covers a large area of the top surface of said multilayer structure 100. The electrical contact 30 is realized as so thin as to be predominantly transparent to the light emitted upwardly from the active layer. With a GaN structure, this can be achieved, for example, by means of a platinum layer of a few nm, e.g. 6 nm. For this reason, the contact can cover a large area of the top side of the multilayer structure and current can be impressed in the active layer 10 over a large area.

Provided on contact 30 is a non-transparent, small-area bonding pad 31.

If a semiconductor layer disposed above active layer 10 is of sufficient electrical conductivity, the large-area transparent contact 30 can be omitted and only a small-area, radiopaque bonding pad 31 provided. Radiation is therefore able to exit next to the bonding pad 31.

In the exemplary embodiment shown, the window layer 20 is formed by an epitaxial substrate, preferably composed of silicon carbide or an SiC-based material, whereas the multilayer structure 100 is based on gallium nitride. This means that the multilayer structure 100 contains, in addition to nitrogen, the elements indium, aluminum and/or gallium. In this material system, p-doped layers are sufficiently electrically conductive only if they are comparatively thin.

Metal contact 40 on the back side of the window layer, i.e., on the back side of epitaxial substrate 20, is preferably realized as a grid. Surprisingly, this increases the reflectivity of the back side of window layer 20.

In another material system, the layers of the multilayer sequence 100 and the substrate can be realized in other ways. For example, with the material system InGaAlP, conductivity can be achieved with thick layers. The substrate can be sapphire or SiC. Whereas with this material system another transparent window can therefore be placed above multilayer structure 100, such an epitaxially grown window cannot be produced in the gallium nitride material system.

In accordance with the invention, it is provided that the transparent window 20 formed by the epitaxial substrate in this exemplary embodiment has its top side in contact with multilayer structure 100 and that the lateral face of the transparent window forms, at least in part, an acute angle a with the multilayer structure 100 in the region of the changeover to said multilayer structure. The side walls 20a, which initially extend obliquely at angle a to the multilayer structure, viz. to the active layer 10, change over in the direction of bottom metal contact 40 into a side wall 20b that extends perpendicularly to the multilayer structure, so that the bottom portion of window 20 and hence of the epitaxial substrate immediately adjacent metal contact 20 per se has a right-parallelepipedally-shaped structure and serves as a mounting pedestal 200. The height of the mounting pedestal is as small as possible in order to minimize voltage drop, and is, for example, within the range of between 100 and 200 µm.

The angle $\alpha$ formed by the planar oblique side walls 20a and a central axis 50 of the semiconductor body is within a range of, e.g., 20° to 80°, depending on the desired radiating behavior. Angle $\alpha$ is especially preferably between 20° and 30°. The output coupling efficiency is highest within this range (cf. FIG. 5).

The window layer is of silicon carbide and the multilayer structure is based on gallium nitride. The detailed construction of such multilayer structures is known to those skilled in the art and thus will not be discussed further here. The radiation emitted upwardly by the active layer 10 is coupled out directly from the multilayer structure 100 upwardly in the direction of metal contact 30. Radiation emitted downwardly, i.e., toward the window layer 20, is first refracted at the boundary between multilayer structure 100 and window layer 20 into the latter. Because these rays, which are directed outwardly toward the external environment of the semiconductor device, strike the oblique lateral faces 20a of the window 20 at an angle that is smaller than the critical angle of total reflection, these light rays can be coupled out of the window and hence the substrate 20, as indicated in FIG. 1a by rays 1 to 4.

However, almost no light is coupled out in the region of the lateral faces 20b of mounting pedestal 200 extending perpendicularly to the active layer. Thus, in the upper portion of substrate 20 having oblique lateral faces 20a, light can be coupled to the outside, whereas in the lower portion of substrate 20 with lateral faces 20b disposed perpendicularly to the mounting surface, almost no light is coupled to the outside and this portion therefore remains dark.

When a light-emitting semiconductor device according to the invention is observed in operation, therefore, the surfaces of the multilayer structure and the oblique lateral faces of the substrate appear luminous, while the mounting pedestal 200 of the substrate 20 remains dark. The light radiated into the region with the perpendicular lateral faces 20b is totally reflected on the side walls 20b and is subsequently reflected from the underside of the substrate 20 to the front side of the semiconductor body.

In this way it is possible to achieve an increase in light output of more than 80% in comparison to right-parallelepipedal chips based on nitride semiconductors on an SiC substrate.

Figure 1B:
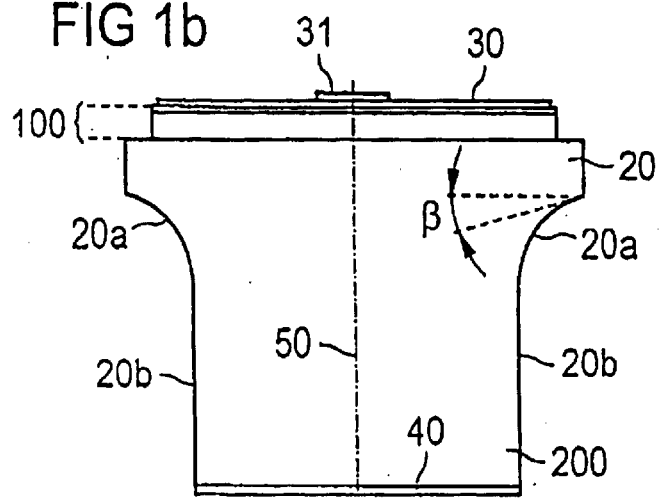

The exemplary embodiment of FIG. 1b differs from that of FIG. 1a essentially in that the lateral faces 20a of the substrate 20 are not planar oblique surfaces, but extend in a stepwise manner toward the vertical central axis 50 of the semiconductor body.

Figure 1C:
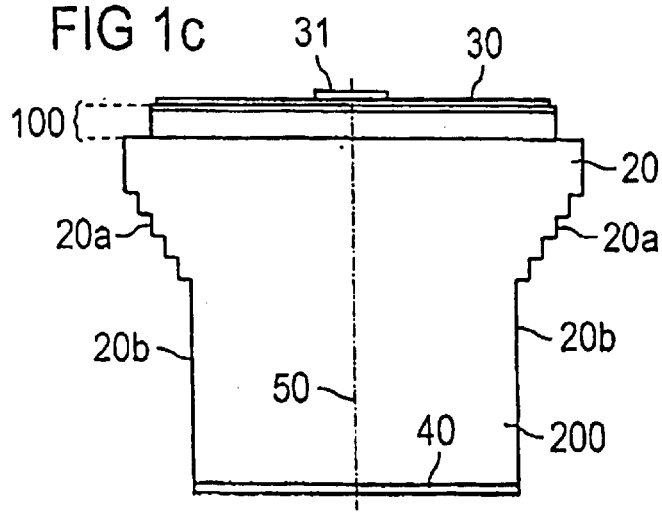

In the exemplary embodiment depicted in FIG. 1c, the planar oblique lateral faces 20a of the exemplary embodiment of FIG. 1a have been replaced by lateral faces 20a that are concave viewed from outside the semiconductor body. Here, substrate 20 initially forms an acute angle $\beta$, viewed from active layer sequence 100, with said active layer sequence 100. In their subsequent extension toward the back side of substrate 20, the side walls change over into side walls 20b of mounting pedestal 200 that are disposed perpendicularly to the back side of the substrate 20. Viewed from multilayer structure 100, this results in a fluid transition of the lateral faces from the initially acute angle $\beta$ to the lateral faces of the parallelepipedoid mounting pedestal 200 extending perpendicularly to the active layer.

In FIGS. 1*a* to 1*c*, the substrate 20 has a higher refractive index than the multilayer structure 100.

In all the exemplary embodiments, lateral faces 20*a* and/or 20*b* can be roughened, for example by etching. If lateral faces 20*b* of mounting pedestal 200 are roughened, radiation can be coupled out of it as well.

In all the embodiments of FIGS. 1*a* to 1*c*, the thickness of the substrate or window 20 is especially preferably between 100 µm and 250 µm (limit values included). An adhesive contact on the underside of the window in a housing should not exceed the height of the mounting pedestal 200. An advantage of such a design is a larger base due to the adhesive bulging out at the sides of the mounting pedestal, making for better heat dissipation and greater stability.

Figure 2A:
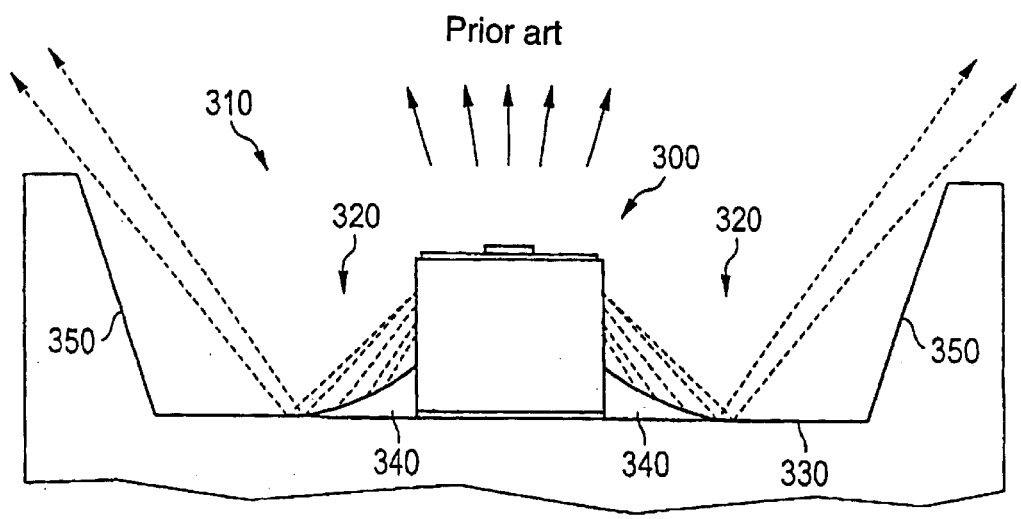
FIGS. 2a to 2e are schematic diagrams of the radiating behavior of a conventional square semiconductor device in a reflector recess of a device housing.

FIG. 2*a* shows the radiating behavior of a conventional right-parallelepipedal semiconductor body 300 mounted in a reflector cup 310 of a device housing. The ray path of the radiation coupled out via the sides of the substrate is indicated by the dashed lines 320 with the arrowheads. The coupling-out of radiation via the lateral sides of the substrate 20 occurs only within a very steep angular range, so that the radiation first strikes the floor 330 of the reflector recess 310, i.e., the conductive adhesive 340 by which the semiconductor 300 is contacted and fastened. If the reflector cup cannot be kept small enough, most of the rays coupled out via the lateral sides, after being reflected on the floor, do not even strike the side walls of the reflector cup, as illustrated schematically in FIG. 2*b* based on the example of a prehoused, surface-mounted style of housing with a reflector cup in a radiopaque base body.

In the case of the radiating behavior, shown in FIG. 3*a*, of a semiconductor body 400 according to the invention comprising a radiotransparent substrate 420 with oblique lateral faces 420*a* and a right-parallelepipedal mounting pedestal 420*b* and mounted by means of conductive adhesive 440 in a reflector cup 410 of a device housing, it is obvious that a large portion of the radiation 460 coupled out via the lateral faces 420*a* is incident not on the cup bottom 430, but directly on the reflector walls 450, and is there reflected in the principal direction of radiation of the semiconductor body. FIG. 3*b* schematically illustrates the ray path that can be obtained with a semiconductor chip according to the invention in a prehoused, surface-mounted style of housing comprising a reflector cup in a radiopaque base body. Because of the fact that, with chip geometry according to the invention, more radiation is coupled out via the sides of the window substrate and a large portion of this radiation is directly incident on the side walls of the reflector, more "backside" radiation is reflected back more strongly in the main direction of radiation of the device.

Figure 2B:
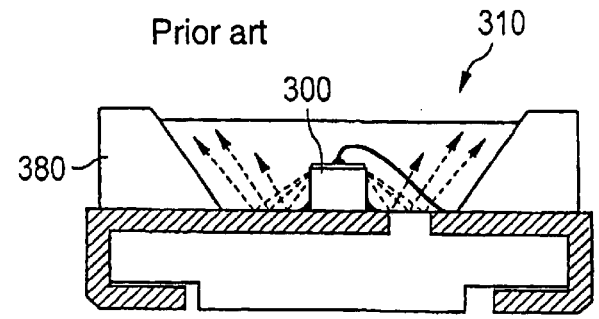
Figure 2C:
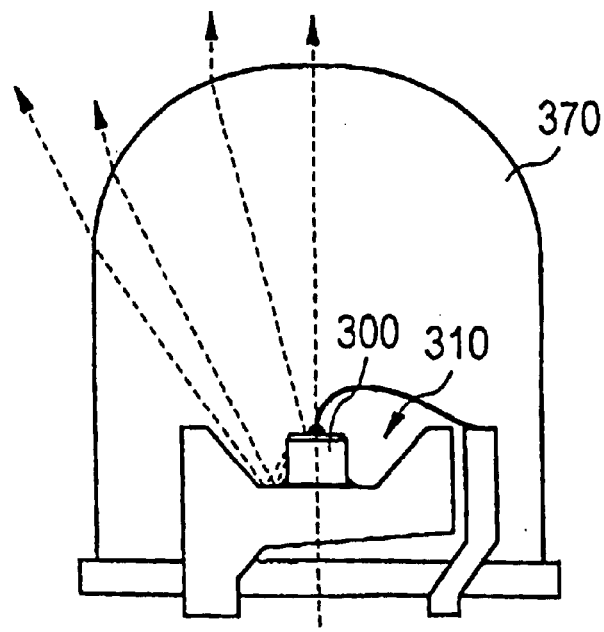
Figure 2D:
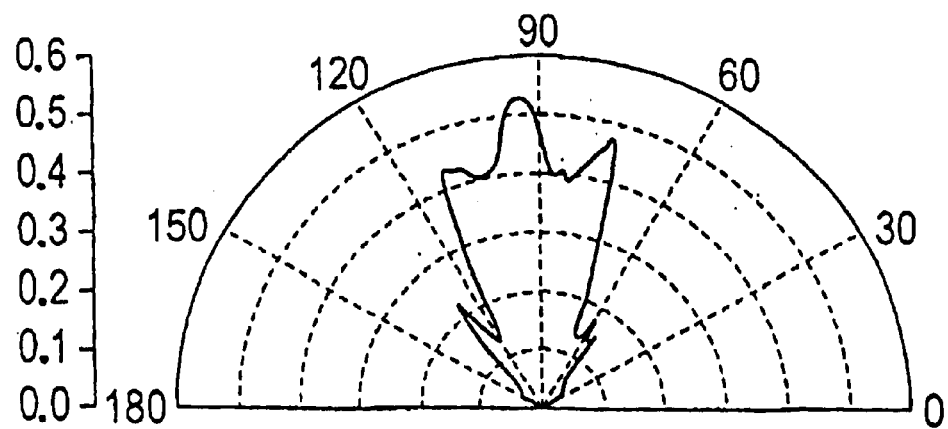

The comparison provided in FIGS. 2*c*, 2*d*, 3*c* and 3*d*, in which a so-called radial design of LED device, wherein the LED chip is adhesively secured in a metal reflector and the surrounding casting 370 and 470 is lens-shaped, is combined on the one hand with a conventional right-parallelepipedal LED chip (FIGS. 2*c* and 2*d*) and on the other hand with an LED chip according to the invention as depicted in FIG. 1*a* (FIGS. 3*c* and 3*d*), elucidates the following:

FIG. 2*d* shows the far field of a 5-mm radial design with a conventional, right-parallelepipedal, InGaN-based LED chip on an SiC window substrate. The casting is clear, so no diffuse scattering occurs. The maximum of the radiation does occur in the forward direction, but secondary lobes can be seen at about 15° deviation from the vertical. These can also be seen on visual observation and may cause problems in certain applications. The ray path for this radial design with a conventional LED chip is illustrated schematically in FIG. 2*c*.

Figure 3E:
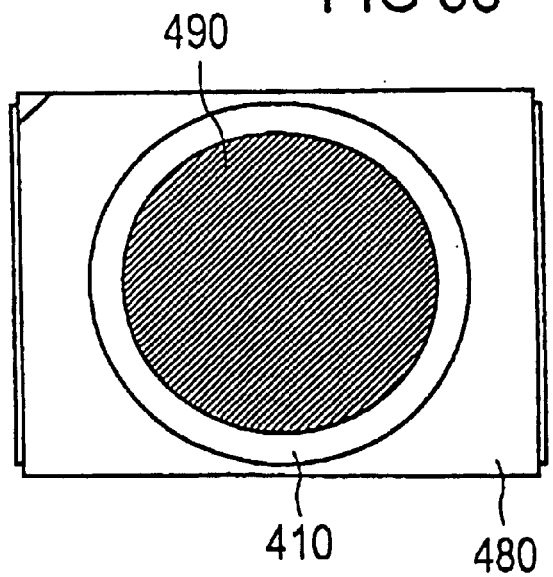
Figure 3C:
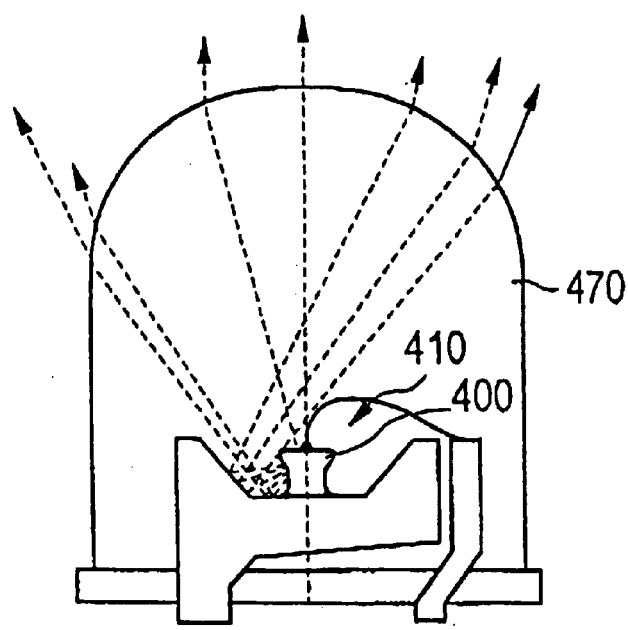
Figure 3D:
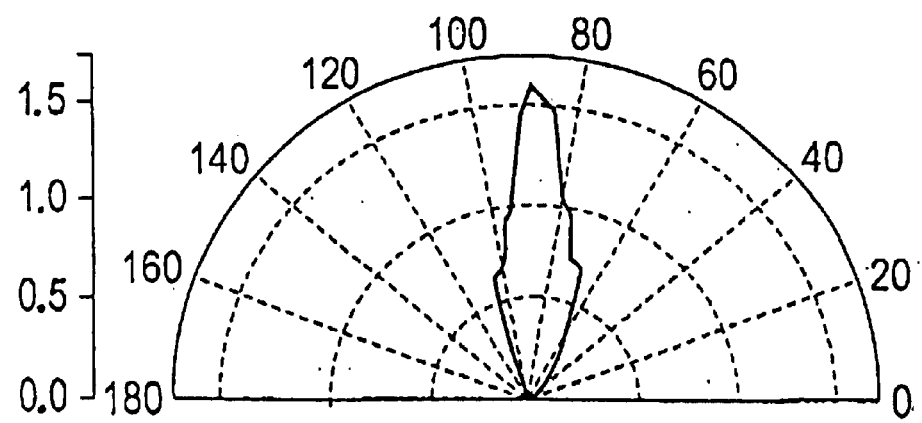

FIG. 3*d* shows the radiation characteristic of the same radial design with an LED chip according to the invention as depicted in FIG. 1*a*. For one thing, the radiation efficiency is markedly increased over that of this design used with a conventional LED chip; for another, the pronounced secondary lobes that appear with this design and a conventional LED chip are not present here. The visual impression given by the radiated light results in a much more homogeneous light pattern for this LED design. The ray path for this radial design with an LED chip according to the invention is illustrated schematically in FIG. 3*c*.

Of course, radiation is also emitted backwardly by a conventional right-parallelepipedal LED chip. However, most of this radiation makes an angle of no more than about 40° with the vertical axis of the chip. This radiation is therefore unable to reach the oblique side walls of the reflector. It consequently strikes only the planar reflector floor or is absorbed in the conductive adhesive with which the LED chip is secured. As shown in FIG. 2*c*, this angle of reflected radiation is so unfavorable that the radiation can no longer be brought exactly into the forward direction. Since the backwardly directed radiation also has a high directional characteristic, the observed secondary lobes occur.

The oblique substrate walls in the window substrate advantageously increase both the radiation efficiency and the range of output coupling angles in the backward direction. The radiation strikes the oblique side walls of the reflector and thus is reflected better in the direction of the lens. In addition, the larger angular range eliminates the secondary lobes.

Figure 2E:
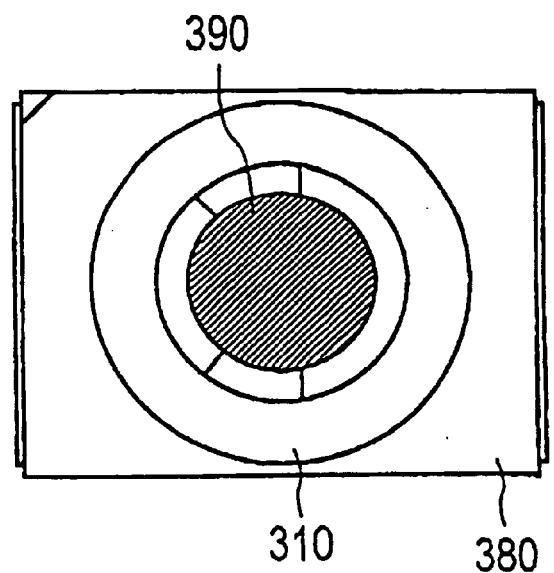

In the surface-mounted design shown in FIGS. 2*b* and 3*b*, comprising a radiopaque housing base body 380, 480 with a reflector recess 310, 410, owing to the limited angle of backward radiation of a conventional, right-parallelepipedal LED chip, only a limited area of the device is struck by light rays (indicated by the dark circular area 390 in FIG. 2*e*). In the housing, the radiation emitted backwardly strikes only the planar floor of the reflector recess. The plastic of which the housing base body is usually composed is not perfectly reflective, causing some of the radiation to be absorbed.

However, if this surface-mountable design is provided with an LED chip according to invention as depicted in FIG. 1*a*, here, too, a large portion of the radiation strikes the oblique reflector walls (cf. FIG. 3*e*). The walls can be provided in a simple manner, for example by means of a reflection-increasing coating [sic]. With an LED chip according to the invention, a much larger area of the reflector is struck by light, as indicated by dark circular area 490 in FIG. 3*e*.

FIGS. 4*a* to 4*c* furnish a comparison of the radiation characteristic of a conventional right-parallelepipedal chip (FIG. 4*a*; edge length of epitaxial layer sequence about 260 µm, edge length of substrate about 290 µm and substrate thickness about 250 µm) and the radiation characteristics of two different semiconductor bodies according to the invention (FIGS. 4*b* and 4*c*). FIG. 4*b* corresponds to a semiconductor body according to FIG. 1*a*, in which the edge length of the epitaxial layer sequence is about 260 µm, the edge length of the substrate is about 290 µm for the top and about 190 µm for the bottom, and the thickness of the substrate is about 250 µm, and in which the planar oblique lateral faces 20*a* of the substrate make a 45° angle with the central axis 50 and are about 25 μm from the top of the substrate. FIG. 4c corresponds to a semiconductor body according to FIG. 1a in which the edge length of the epitaxial layer sequence is about 260 μm, the edge length of the substrate is about 290 μm for the top and about 190 μm for the bottom, and the thickness of the substrate is about 250 μm, and in which the planar oblique lateral faces 20a of the substrate make a 30° angle with the central axis 50 and are about 25 μm from the top of the substrate. All the semiconductor bodies have exactly the same multilayer structure 100 and substrate material (SiC). The diagrams give the angle of radiation in a 360° representation and the radiation intensity in the directions concerned on the basis of concentric circles.

It can be seen from FIG. 4a that a known right-parallelepipedal light-emitting GaN-based chip with an SiC substrate radiates upwardly in the direction 0° with an aperture angle of about 60° and steeply backwardly with essentially two additional narrow lobes oriented toward 125° and 235°, each with an aperture angle of about 15°.

In contrast, the semiconductor body according to the invention, as depicted in FIG. 4c, which has the same multilayer structure 100 and an SiC substrate 20, exhibits a sharply increased ray intensity, compared to FIG. 4a, in the angular range between about 95° and about 130° and in the angular range between about 230° and about 265°. Moreover, an improvement is also clearly visible in the angular range between 30° and 330°. The chip therefore radiates nearly horizontally via the oblique lateral faces 20a. Overall, with an arrangement according to FIG. 4c there is a marked—i.e. 80% or more—improvement in light output coupling behavior over that of a chip of conventional geometry.

It is true that the semiconductor body corresponding to FIG. 4b also has an improved output coupling characteristic compared to a conventional semiconductor body (compare with FIG. 4a), but falls far short of the improvement provided by the semiconductor body corresponding to FIG. 4c.

In the graph of FIG. 5, the output coupling efficiency, as a %, is plotted as a function of the angle a of the oblique lateral faces 20a to the vertical central axis of a semiconductor body according to the embodiment of FIG. 1a, comprising a multilayer structure on a GaN base (nGaN= 2.5) on an SiC window substrate (nSiC=2.7). The edge length of substrate 20 above oblique lateral faces 20a is kept constant at 290 μm. The angle dependence was determined for three different edge lengths of the mounting pedestal. That is, the ratio of the top edge length to the bottom edge length of the window was varied. Curve 501, marked with the triangles, corresponds to a window bottom edge length of 165 μm; curve 502, with the squares, to 190 μm; and curve 503, with the diamonds, to 215 μm. It is evident in all cases that the output coupling efficiency is greatest when α is between 20° and 30° and that it decreases sharply both at very small and very large angles α.

Because of the higher refractive index of SiC in comparison to GaN, radiation passing from the multilayer structure into the window substrate is refracted in the direction of the vertical. An angular range from the multilayer structure is thereby compressed in the window substrate. Slanting the sides of the window substrate achieves the effect of causing this compressed angular range to overlap with the coupling-out cone of the sides, insofar as possible.

The graph of FIG. 5 was determined by means of a ray-tracing calculation based on a three-dimensional model of the semiconductor chip. This calculation includes all the possible radiation conduits of the chip: the surface, the mesa edges and the straight lateral sides of the substrate. A predominance of backward radiation via the sawn edges can be observed. This calculation is confirmed by experiments with various lateral-side angles, which are produced especially preferably by means of a saw blade having a shaped edge (see below). A 45° saw blade resulted in an increase in light output of 50% over that of a conventional right-parallelepipedal chip and a 30° saw blade resulted in an increase of more than 80%.

Figure 6:
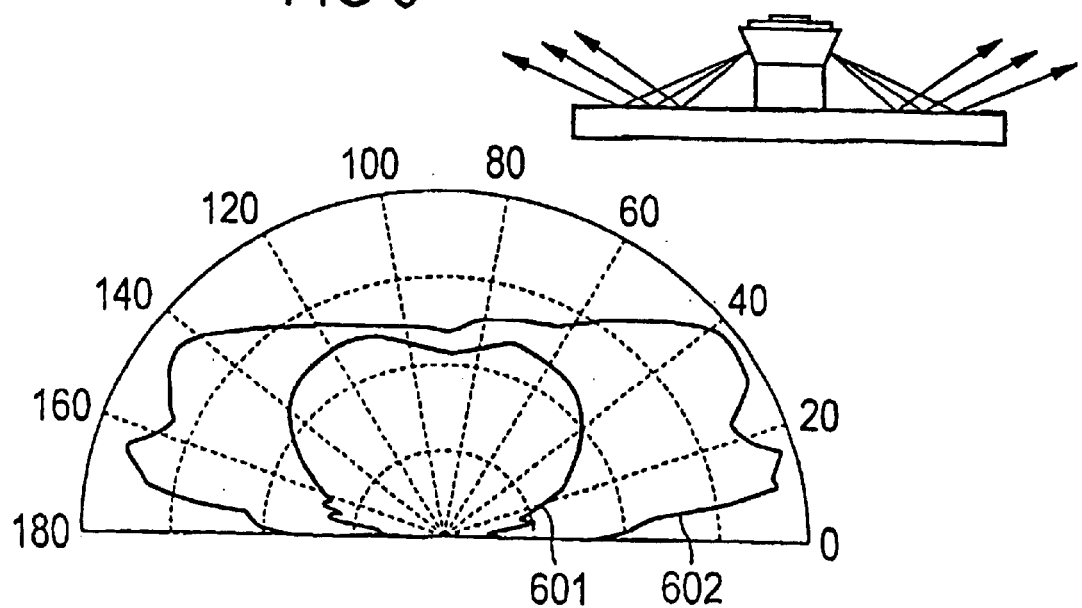
FIG. 6 is a comparison of the far-field characteristic of a conventional right-parallelepipedal semiconductor device with the semiconductor device according to the invention comprising planar oblique lateral faces of a window layer, mounted in each case on a planar reflective mounting surface.

In FIG. 6, the far-field characteristic of a conventional right-parallelepipedal chip is compared to that of a chip according to the invention, as depicted in FIG. 1a, with α between 20° and 30° (limit values included), each mounted on a planar reflective surface. The inner curve 601 represents the conventional chip and the outer curve 602 the chip according to the invention.

For a semiconductor device according to the invention having a square lateral cross section and in which all four sides of the window layer 20 comprise a planar, oblique, first side-wall portion 20a, the ratio of the edge length of the multilayer structure 100 to the edge length of the mounting pedestal is preferably between 1.5 inclusively and 2 inclusively, especially preferably about 1.35.

With regard to the optical device according to FIG. 7, it is provided that a semiconductor body according to the invention, for example as depicted in FIG. 1a, is mounted in the recess 71 of a base body 70. The base body 70 can be, for example, as depicted in FIG. 7, an electrical lead part of a radial LED that is in electrical contact with metal contact 40 of the semiconductor body, while metal contact 30 is connected via a bonding wire to a second electrical lead part 72 of the LED. The arrangement as a whole is enveloped in a transparent material 73.

The light-emitting semiconductor device according to the invention can equally well be arranged in the housing or base housing of an upwardly radiating surface-mountable LED. Here, too, a base body is formed that has a recess in which the semiconductor device is mounted.

The side walls 74 of recess 71 in base body 70 are realized as a reflector, which can be accomplished either by the choice of material for the base body or by applying a coating to the recess. The reflector is advantageous for beneficially reflecting the light that is reflected laterally obliquely downward according to FIG. 6b forwardly in the direction of metal contact 30 of the semiconductor device. The shape of the reflector 74 is selected so as to yield the desired reflection characteristic. For radiation that is oriented sharply upward or frontward, it is advantageous to have a reflector shape in which the lateral inclination increases toward the outside, for example a semiparabola.

Figure 8:
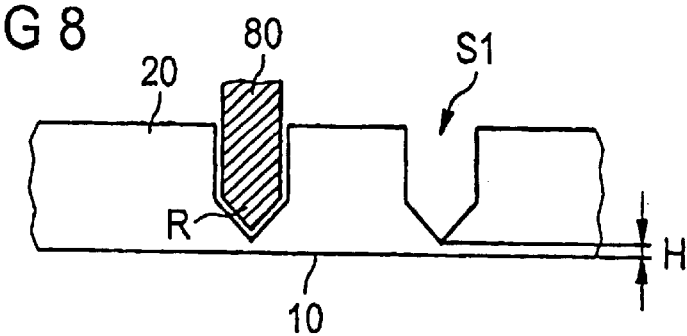
FIGS. 8 to 11 are implementation steps of a method for fabricating a light-emitting semiconductor device according to the invention.
Figure 9:
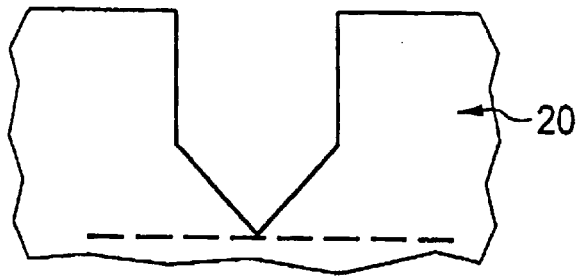

The fabrication of a light-emitting semiconductor device according to the invention, or, to be more exact, the simultaneous fabrication of a plurality of semiconductor devices, is sketched in FIGS. 8 to 11. In FIG. 8, the light-emitting layer 10 and the window 20 are identified schematically by means of the reference numerals of FIG. 1. In the exemplary embodiment, the light-emitting layer is provided at sites where the subsequent light-emitting device is to be produced. To this end, as illustrated in FIG. 8, the multilayer structure (not shown in further detail) with the desired active layers 10 is first produced on the substrate 20 by methods that are known per se. These fabrication methods particularly include masking and coating techniques, for example epitaxial processes. After epitaxy, the epitaxial layer sequence is preferably separated into a plurality of multilayer structures by masking and etching.

In accordance with the invention, after the production of the multilayer structures, the arrangement is sawn into from the back side, i.e., the window side, along the opposite etched channels between the multilayer structures of the chips-to-be, by means of a shaped saw blade whose edge R has a predetermined shape. In the exemplary embodiment, the edge is realized as V-shaped. The sawing is done in such a way that not only is the substrate incised with the tip of the V-shaped saw blade 80, but the cut is also made to a sufficient depth that the blade-shaped portion of the saw blade saws into the substrate as well. Thus the result is a sawcut S1 that initially penetrates the substrate with vertical walls, thereafter to pass into a shape that corresponds to the edge shape R of the saw blade, in this case a "V". A round profiled edge or one of another shape is also possible.

The residual height H that remains, after the sawing, between the notch in the substrate and the light-emitting layer typically measures 10 µm to 100 µm. FIG. 9 shows, again with reference to FIG. 1, how angle α according to FIG. 1 is formed between the V-shaped cut and the light-emitting layer 10.

Figure 10:
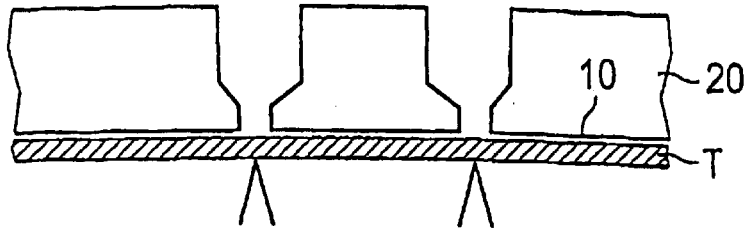
Figure 11:
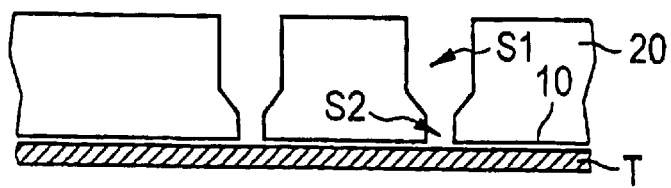

After the partial sawing according to FIG. 8, depending on the residual height H, the devices are separated preferably either by a wedge breaking method as depicted in FIG. 10 or by means of a second sawcut. For this purpose, the cut-into arrangement according to FIG. 8 is adhesively fastened to a carrier T. As shown in FIG. 10, the residual height H is then broken away by means of a breaking wedge applied to the unoccupied underside of the carrier. As shown in FIG. 11, it is alternatively possible to divide the wafer by means of a second sawcut S2, so that the individual semiconductor devices are separated.

The choice of the edge shape R of the profiled saw blade is governed by the desired lateral faces for the substrate, which in turn is governed by the manner in which the maximum coupling-out of light can be achieved. Depending on the refractive index of the semiconductor material and the environment or substrate, typical angles α for a V-shaped sawcut are between 10° and 70°.

Figure 12:
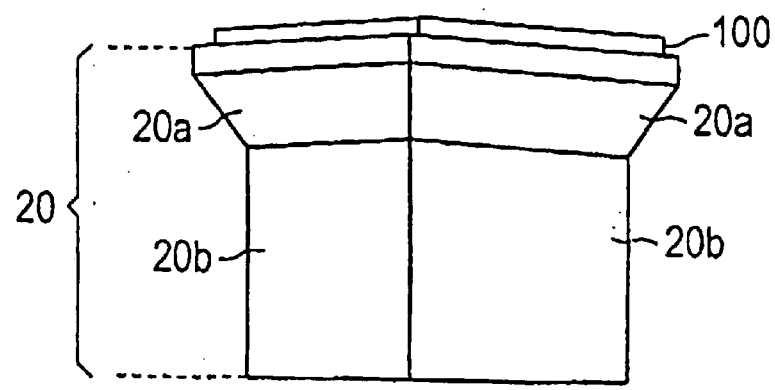
FIG. 12 is a perspective view of an especially preferred semiconductor device according to the invention.

A perspective view of a preferred semiconductor device according to the invention comprising an SiC epitaxial substrate or window substrate and a GaN-based multilayer stricture 100 is illustrated in FIG. 12.

What is claimed is:

1. A method for fabricating a plurality of radiation-emitting semiconductor devices, each said device including a multilayer structure that contains a radiation-emitting active layer and a radiotransparent window layer that is disposed on a side of said multilayer structure facing away from a main direction of radiation of the semiconductor device, said window layer including a first side wall portion which extends obliquely, concavely or in a stepwise manner with respect to a central axis of the semiconductor device lying perpendicular to the multilayer sequence, and which in its subsequent extension toward the back side, viewed from said multilayer structure, changes over into a second side wall portion that forms a mounting pedestal for said semiconductor device, said method comprising the following steps:

fabricating a plurality of mutually adjacent multilayer structures on a large area substrate wafer including a radiotransparent window layer, sawing into said substrate wafer from the back of the substrate, with a saw blade having a shaped edge that has the negative shape of the intended oblique, concave or stepwise shape of said first side wall portions, to a predetermined depth at which the blade-shaped portion of said saw blade saws into said substrate, said saw blade also having a blade side surface having a negative shape of said second sidewall portion, dividing said wafer along said sawcuts into separated devices, and processing the separated devices further.

2. The method as recited in claim 1, wherein the dividing is done by means of a breaking method or a second sawcut.

3. The method as recited in claim 1 or 2, wherein before the back of said substrate is sawn into, metal contacts are produced on the unoccupied surfaces of said substrate or said multilayer structure.

4. The method of claim 1, wherein the sawing is performed with a saw blade having a V-shaped edge.

5. The method of claim 4 wherein a surface of said V-shaped edge forms with said central axis an angle that is between 20° and 30°.

6. The method of claim 1 wherein said second sidewall portion and said blade side surface extends parallel to said central axis.

7. The method of claim 1 wherein said substrate wafer is an epitaxial substrate, and said fabricating includes growing said multilayer structure on said epitaxial substrate.

8. The method of claim 1 wherein said further processing includes mounting a said separated device with a reflector cup that has a floor and oblique or paraboloid side walls such that said window layer is oriented toward the floor of said reflector cup.

9. A method for fabricating a plurality of radiation-emitting semiconductor devices, each said device including a multilayer structure that contains a radiation-emitting active layer and a radiotransparent window layer that is disposed on a side of said multilayer structure facing away from a main direction of radiation of the semiconductor device, said window layer including a first side wall portion which extends outwardly with respect to a central axis of the semiconductor device lying perpendicular to the multilayer sequence, and which in its subsequent extension toward the back side, viewed from said multilayer structure, changes over into a second side wall portion that forms a mounting pedestal for said semiconductor device, said method comprising the following steps:

fabricating a plurality of mutually adjacent multilayer structures on a large area substrate wafer including a radiotransparent window layer, sawing into said substrate wafer from the back of the substrate, with a saw blade having a shaped edge that has the negative shape of the intended outwardly extending shape of said first side wall portions, to a predetermined depth at which the blade-shaped portion of said saw blade saws into said substrate, said saw blade also having a blade side surface having a negative shape of said second sidewall portion, dividing said wafer along said sawcuts into separated devices, and processing the separated devices further.

10. The method as recited in claim 9, wherein the dividing is done by means of a breaking method or a second sawcut.

11. The method as recited in claim 9, wherein before the back of said substrate is sawn into, metal contacts are produced on the unoccupied surfaces of said substrate or said multilayer structure.

12. The method of claim 9, wherein the sawing is performed with a saw blade having a V-shaped edge.

13. The method of claim 9 wherein a surface of said V-shaped edge forms with said central axis an angle that is between 20° and 30°.

14. The method of claim 9 wherein said second sidewall portion and said blade side surface extends parallel to said central axis.

15. The method of claim 9 wherein said substrate wafer is an epitaxial substrate, and said fabricating includes growing said multilayer structure on said epitaxial substrate.

16. The method of claim 9 wherein said further processing includes mounting said separated device with a reflector cup that has a floor and oblique or paraboloid side walls such that said window layer is oriented toward the floor of said reflector cup.

17. The method of claim 9, wherein the first side wall portion extends away from the central axis obliquely.

18. The method of claim 9, wherein the first side wall portion extends away from the central axis concavely.

19. The method of claim 9, wherein the first side wall portion extends away from the central axis in a stepwise manner.

20. A method for making radiation-emitting semiconductor devices, the method comprising:

fabricating multilayer structures on a front side of a substrate, each multilayer structure comprising at least one radiation-emitting active layer;

inserting a shaped blade into a back side of the substrate to produce a shaped side wall in the substrate, wherein the shaped side wall corresponds to the shape of the blade and comprises a first portion and a second portion, with the first portion extending away from a central axis perpendicular to one of the multilayer structures relative to the second portion;

separating the substrate into different pieces along the shaped side wall, with each piece including a multilayer structure; and processing each piece further, to produce the radiation-emitting semiconductor devices.

21. The method of claim 20, wherein the first portion of the shaped side wall extends away from the central axis obliquely, concavely, or in a stepwise manner.

22. The method of claim 21, wherein the first portion of the shaped side wall extends away from the central axis obliquely.

23. The method of claim 21, wherein the first portion of the shaped side wall extends away from the central axis concavely.

24. The method of claim 21, wherein the first portion of the shaped side wall extends away from the central axis in a stepwise manner.

25. The method of claim 20, wherein the second portion of the side wall forms part of a mounting pedestal for one of the separated pieces during the further processing.

26. The method of claim 20, wherein the insertion of the shaped blade into the back side of the substrate comprises sawing into the back side of the substrate with the shaped blade.

27. The method of claim 20, wherein the substrate comprises a window adjacent the multilayer structure, wherein the window is transparent to radiation emitted by the active layers.

28. The method of claim 20, wherein the separating comprises breaking or sawing.

29. The method of claim 20, further comprising forming metal contacts on any of the multilayer structures and unoccupied surfaces of the front side of the substrate before the insertion of the shaped blade into the back side of the substrate.

30. The method of claim 20, wherein the shaped blade comprises a V-shaped edge.

31. The method of claim 30, wherein a surface of the V-shaped edge forms with said central axis an angle that is between 20° and 30°.

32. The method of claim 20, wherein the second portion of the shaped side wall extends parallel to said central axis.

33. The method of claim 20, wherein the substrate is an epitaxial substrate, and the fabricating comprises growing the multilayer structures on the epitaxial substrate.

34. The method of claim 20, wherein the further processing comprises mounting the separated pieces within a reflector cup that has a floor and oblique or paraboloid side walls such that the back side of the substrate is oriented toward the floor of the reflector cup.

* * * * *

UNITED STATES PATENT AND TRADEMARK OFFICE
CERTIFICATE OF CORRECTION

PATENT NO. : 7,195,942 B2  Page 1 of 1
APPLICATION NO. : 10/837828
DATED : March 27, 2007
INVENTOR(S) : Dominik Eisert et al.

It is certified that error appears in the above-identified patent and that said Letters Patent is hereby corrected as shown below:

<u>Column 4</u>
Line 33, replace "AlN, AlGaN, InGaN, INAIN and AllnGaN" with -- AlN, AlGaN, InGaN, InAlN and AllnGaN --

Signed and Sealed this

Fifth Day of August, 2008

JON W. DUDAS
*Director of the United States Patent and Trademark Office*